United States Patent

Tsuboi et al.

[11] Patent Number: 5,838,604
[45] Date of Patent: Nov. 17, 1998

[54] SEMICONDUCTOR MEMORY DEVICE WITH AN INCREASED BAND WIDTH

[75] Inventors: Hironobu Tsuboi; Yoshinori Okajima; Tsuyoshi Higuchi; Makoto Koga, all of Kawasaki, Japan

[73] Assignee: Fujitsu Limited, Kanagawa, Japan

[21] Appl. No.: 803,448

[22] Filed: Feb. 20, 1997

[30] Foreign Application Priority Data

Sep. 17, 1996 [JP] Japan .................................. 8-244904

[51] Int. Cl.⁶ .................................................. G11C 5/06
[52] U.S. Cl. ............................ 365/63; 365/51; 365/207; 365/230.03
[58] Field of Search .............................. 365/207, 230.03, 365/200, 63, 51

[56] References Cited

U.S. PATENT DOCUMENTS

| | | | |
|---|---|---|---|
| 5,638,335 | 6/1997 | Akiyama et al. | 365/63 X |
| 5,648,928 | 7/1997 | Yoom et al. | 365/63 |
| 5,687,108 | 11/1997 | Proebsting | 365/63 X |
| 5,691,933 | 11/1997 | Takenaka | 365/63 |

*Primary Examiner*—Do Hyun Yoo
*Attorney, Agent, or Firm*—Nikaido Marmelstein Murray & Oram, LLP

[57] ABSTRACT

A semiconductor memory device includes a plurality of bit lines, first sense amplifiers each connected to a corresponding one of the plurality of bit lines, and a first data bus laid out in parallel to the plurality of bit lines and connected to the plurality of bit lines via gates and the first sense amplifiers. The semiconductor memory device further includes column-selection lines laid out perpendicularly to the plurality of bit lines to open at least one of the gates to connect the first data bus to the plurality of bit lines.

16 Claims, 12 Drawing Sheets

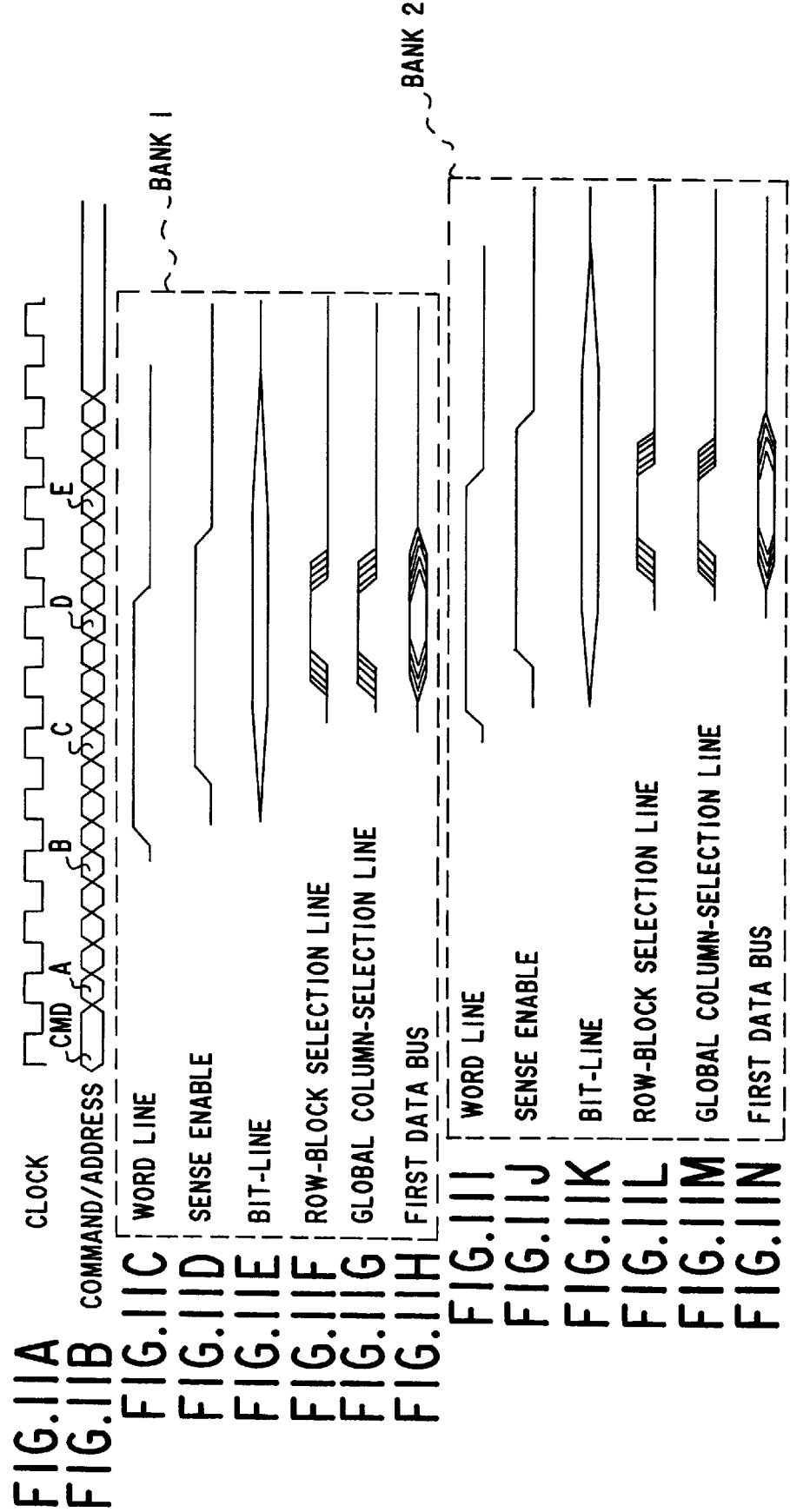

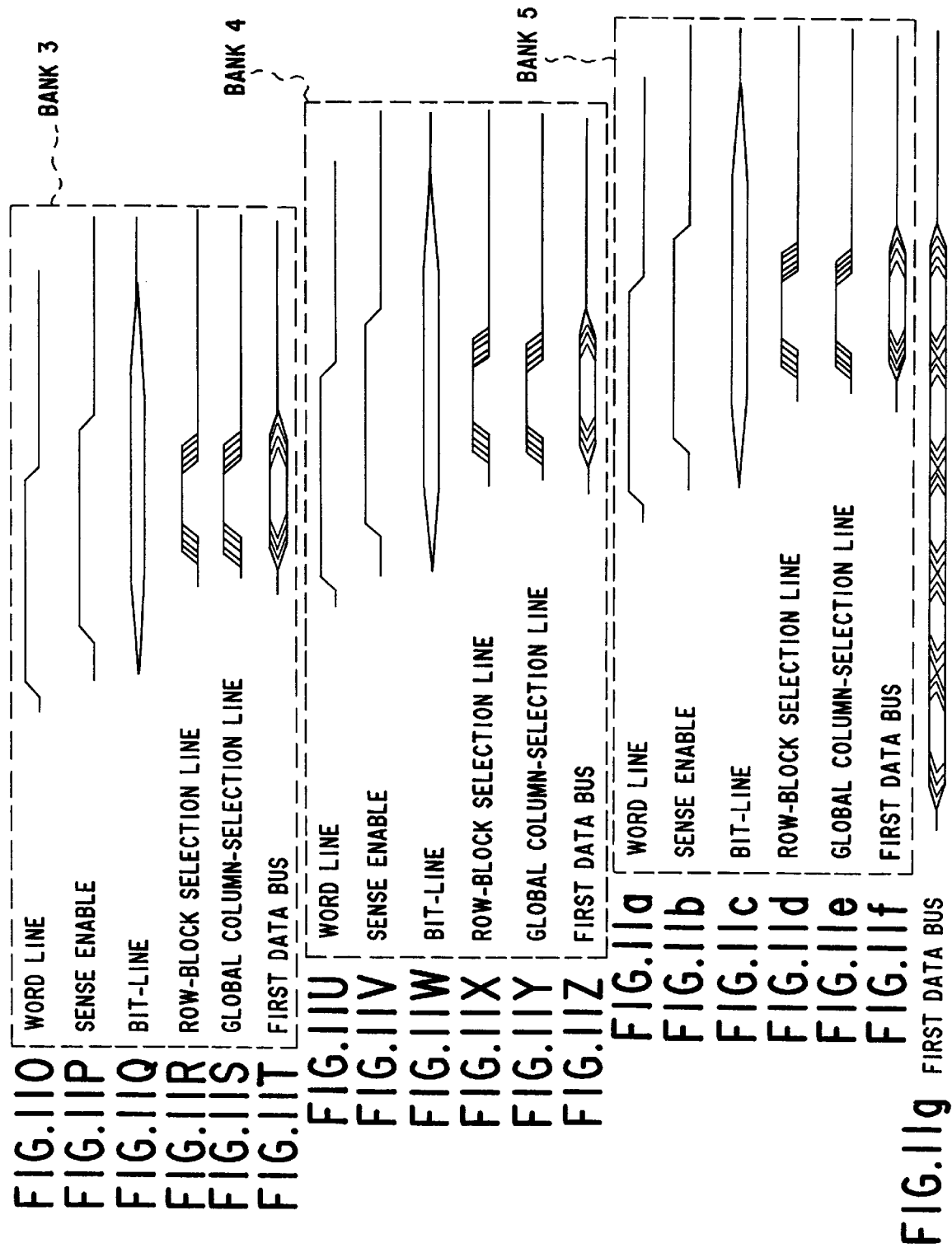

SEMICONDUCTOR MEMORY DEVICE WITH AN INCREASED BAND WIDTH

BACKGROUND OF THE INVENTION

1. Field of the Invention

The present invention generally relates to DRAMs (dynamic random access memories), and particularly relates to a layout of a memory core in a DRAM.

2. Description of the Related Art

FIG. 1 is an illustrative drawing for explaining a configuration of a memory core and peripherals thereof in a prior-art DRAM. The DRAM of FIG. 1 includes a memory block 300, a row decoder 301, a column decoder 302, sense amplifiers 303, an input/output latch 304, a data bus 305, a sense-amplifier area 306, a local-word-driver area 307, cell blocks 308, global data buses 310, a data-bus switch 311, a local data bus 312, column-selection lines 313, a global word line 314, and input/output lines 320. The DRAM of FIG. 1 is shown in a simplified form, and is provided for explaining a layout of data-signal lines used for data transfer in data-write/data-read operations as well as a layout of address-signal lines used for accessing a particular address within the memory block 300.

One memory chip includes a plurality of memory blocks identical to the memory block 300 shown in FIG. 1. An attempt to access a particular address in the memory chip leads to a selective activation of one memory block among the plurality of the memory blocks 300, and this particular address in the selected memory block 300 is accessed. The memory block 300 includes a plurality of the cell blocks (cell matrixes) 308 arranged in columns and rows. One of the cell blocks 308 contains a plurality of memory cells (not shown) structured in a matrix form. Each memory cell stores one bit of data. In order to access a memory cell at an indicated address in the memory block 300, the row decoder 301 and the column decoder 302 are used.

The row decoder 301 selects a position in a vertical direction in the drawing within the memory block 300. First, one of a plurality of global word lines 314 is selected (FIG. 1 shows only the selected one of the global word lines 314) to choose one line of the cell blocks 308 arranged in a matrix form. The selected global word line 314 conveys a word address signal comprising a plurality of bits. Between the cell blocks 308 of each pair of adjacent columns, the local-word-driver area 307 is provided. The local-word-driver area 307 contains word drivers (not shown) arranged in a column. The word address signal on the global word line 314 selects one of the word drivers arranged in the column to activate a word line connected to the selected word driver. This results in a selection of memory cells with respect to rows.

Upon the selection of the memory cells with respect to rows, data is read out from (or written in) the selected memory cells. An operation will be described below by taking a read operation as an example. First, data of the selected memory cells is read out and stored in a line of sense amplifiers (not shown) arranged in the sense-amplifier area 306 via bit lines (not shown). These bit lines are laid out in parallel with the column-selection lines 313, and the sense-amplifier area 306 is provided between vertically adjacent cell blocks 308 with respect to each column of the cell blocks 308 arranged in a matrix form within the memory block 300.

The column decoder 302 selects a position in a horizontal direction in the drawing within the memory block 300. Namely, the column decoder 302 selects and activates one of the column-selection lines 313 extending in a vertical direction to select memory cells with respect to columns. In detail, the column-selection lines 313 are connected to the sense amplifiers in the sense-amplifier area 306, and a sense amplifier corresponding to the activated column-selection line 313 supplies data to the local data bus 312.

The data on the local data bus 312 is transferred to the global data bus 310 via the data-bus switch 311, which is provided between columns of the cell blocks 308. The data on the global data bus 310 is then read by one of the sense amplifiers 303. The data-bus switch 311 is used for freeing the global data bus 310 from the load of unselected local data buses 312. (The local data bus 312 is provided for each row of the cell blocks 308.)

In FIG. 1, each of the global data buses 310 conveys two bits of information, for example. In this case, each of the four sense amplifiers 303 receives two-bit data from a corresponding column of the cell blocks 308 at one data-read operation. Eight bits in total are thus read out from the memory block 300. This eight-bit data is provided to the data bus 305 provided in the memory chip. The data bus 305 is connected to a plurality of the memory blocks 300 in the memory chip.

The data supplied to the data bus 305 is latched by the input/output latch 304, and is output from the chip via the input/output lines 320.

In DRAMs, the concept of a band width is often used as an indicator for representing a data-write/data-read capacity. The band width is a product of an operating frequency of a DRAM with the number of bits in data written in or read from the memory chip. The higher the operating frequency and the larger the number of data bits, the greater the band width of the DRAM.

Under a condition of a constant operating frequency, the number of data bits needs to be increased in order to boost the band width. The number of data bits can be increased by selectively activating more than one memory block within a memory chip, for example. Assuming that eight-bit data is read from one memory block as shown in FIG. 1, activation of four memory blocks, for example, achieves a 32-bit data read operation. Activating a plurality of memory blocks, however, is not preferable because this leads to an increase in power consumption. It is thus preferable to obtain a larger number of data bits from a single memory block.

In order to increase the number of data bits with respect to the memory block of FIG. 1, the number of the global data buses 310 or the number of signal lines making up each bus needs to be increased. In the layout of the memory block shown in FIG. 1, however, the global data buses 310 extend in parallel with the column-selection lines 313. Because of such a layout, there is no room for the global data buses 310 except for a space in the local-word-driver area 307. In other words, there is no choice but to lay out the global data buses 310 in a space which is not occupied by the column-selection lines 313. Restriction on an available space limits the number of signal lines which can be laid out. The space can be enlarged to accommodate a larger number of signal lines, but this is not preferable because this will lead to an increase in chip size.

In the layout as shown in FIG. 1, therefore, an attempt to increase the band width will result in an increase in the chip size. To put it differently, it is difficult to reduce the chip size while maintaining a constant band width.

When power consumption in DRAMs is taken into consideration, the number of memory blocks in a memory chip is preferably increased so as to decrease the size of each memory block. Decreasing the size of each memory block leads to a smaller area being selected and activated, thereby achieving a reduction in the power consumption. As discussed in the above, however, decreasing the chip size of the memory block while maintaining a constant band width is hard to achieve. Because of this, an attempt to increase the number of memory blocks in a memory chip while maintaining a constant band width would lead to an undesirable enlargement of the overall chip size.

Accordingly, there is a need for a DRAM which has an increased band width without an enlargement of the chip size.

SUMMARY OF THE INVENTION

Accordingly, it is a general object of the present invention to provide a DRAM which can satisfy the need described above.

It is another and more specific object of the present invention to provide a DRAM which has an increased band width without an enlargement of the chip size.

In order to achieve the above objects, a semiconductor memory device according to the present invention includes a plurality of bit lines, first sense amplifiers each connected to a corresponding one of the plurality of bit lines, and a first data bus laid out in parallel to the plurality of bit lines and connected to the plurality of bit lines via gates and the first sense amplifiers. The semiconductor memory device further includes column-selection lines laid out perpendicularly to the plurality of bit lines to open at least one of the gates to connect the first data bus to the plurality of bit lines.

In the semiconductor memory device described above, the first data bus for signal transfer is laid out in parallel to the bit lines, and the column-selection lines for column-address selection are arranged perpendicular to the bit lines. With such a configuration, the space which is occupied by the column-selection lines in prior-art DRAMs can be used for the first data bus for signal transfer, thereby allowing a large number of lines to be arranged.

Other objects and further features of the present invention will be apparent from the following detailed description when read in conjunction with the accompanying drawings.

BRIEF DESCRIPTION OF THE DRAWINGS

FIGS. 11A through 11Z and 11a through 11g are timing charts for explaining high-speed-data-read operations based on a bank-interleave operation in the DRAM of FIG. 2.

DESCRIPTION OF THE PREFERRED EMBODIMENTS

In the following, a principle and embodiments of the present invention will be described with reference to the accompanying drawings.

Figure 2:
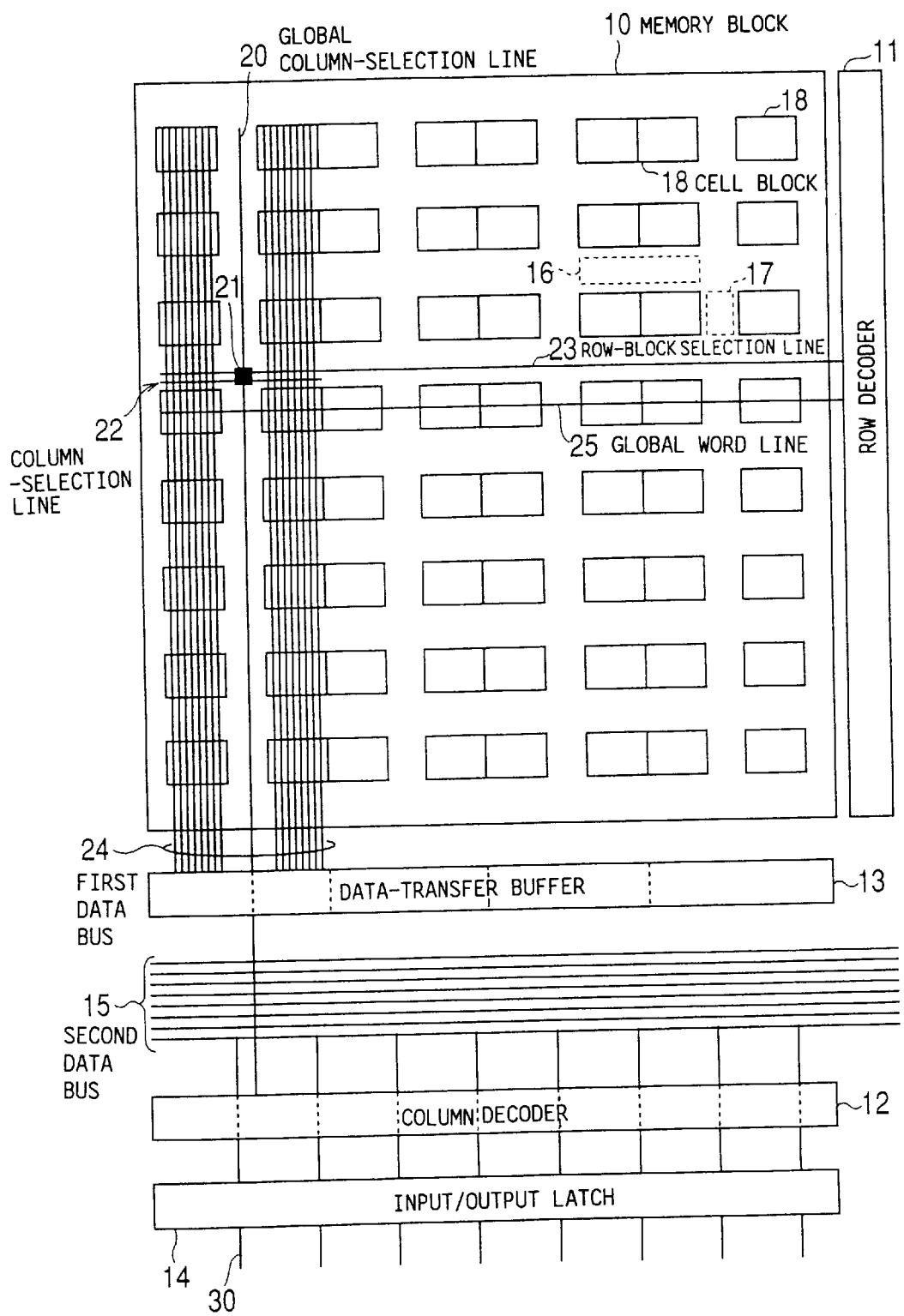
FIG. 2 is an illustrative drawing showing a memory core and peripherals thereof in a DRAM according to a principle of the present invention.

FIG. 2 is an illustrative drawing showing a memory core and peripherals thereof in a DRAM according to a principle of the present invention. According to the principle of the present invention, columns-selection lines and data buses are arranged perpendicularly with each other, so that a sufficient space is provided for laying out the data buses.

The DRAM of FIG. 2 includes a memory block 10, a row decoder 11, a column decoder 12, a data-transfer buffer 13, an input/output latch 14, a second data bus 15, a sense-amplifier area 16, a local-word-driver area 17, cell blocks 18, a global column-selection line 20, a row-block selection unit 21, a column-selection line 22, a row-block selection line 23, a first data bus 24, a global word line 25, and input/output lines 30.

One memory chip is provided with a plurality of memory blocks identical to the memory block 10 shown in FIG. 2. When the memory chip receives an indication of an address, one of the memory blocks 10 is selectively activated, and access is made to the indicated address in the selected memory block 10. The memory block 10 is provided with a plurality of the cell blocks (cell matrixes) 18 arranged in rows and columns. Each of the cell blocks 18 contains a plurality of memory cells (not shown) provided in a matrix arrangement. Each memory cell holds one bit of data. In order to access a memory cell at a particular address in the memory block 10, the row decoder 11 and the column decoder 12 are used.

Figure 1:
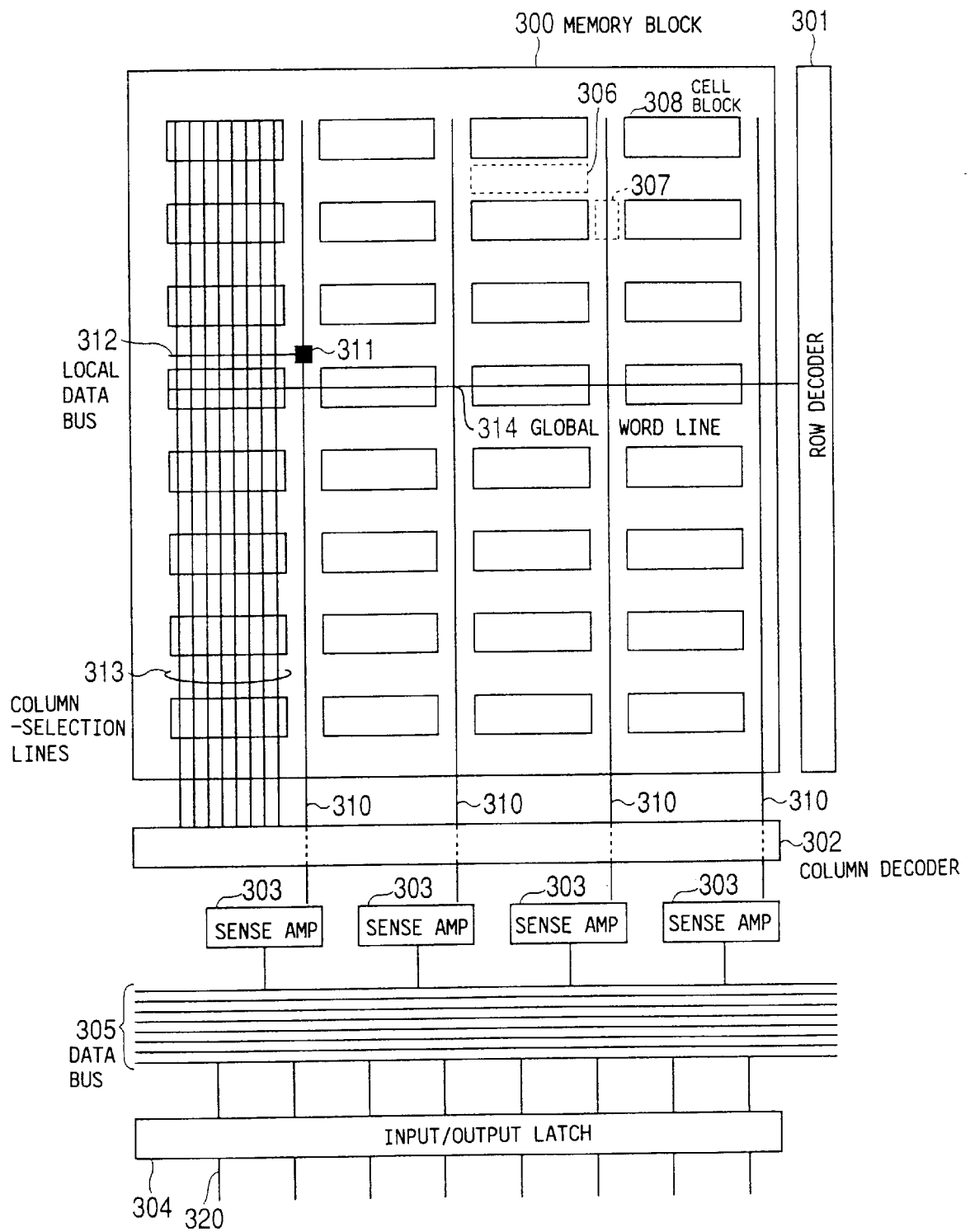
FIG. 1 is an illustrative drawing for explaining a configuration of a memory core and peripherals thereof in a prior-art DRAM.

The DRAM of the present invention shown in FIG. 2 makes a row selection by using a global word line and a line of local word drivers arranged in the local-word-driver area in the same manner as in the prior-art DRAM of FIG. 1. The row decoder 11 first selects one of a plurality of global word lines 25 (only the selected global word line is shown in the figure) to chose one of the cell blocks 18 arranged in a matrix. The selected global word line 25 conveys a plurality of bits representing a word address. Between the cell blocks 18, the local-word-driver area 17 is provided for each column, and this local-word-driver area 17 includes a line of local word drivers (not shown). The word address signal on the global word line 25 selects one of the local word drivers, and activates a word line connected to the selected local word driver. In this manner, a selection of memory cells is made with respect to columns.

Bit lines connected to cells of the cell blocks 18 extend in parallel to the first data bus 24, and are connected to a line of sense amplifiers (not shown) in the sense-amplifier area 16 via gates (not shown). The global column-selection line 20 extending from the column decoder 12 in parallel to the first data bus 24 is arranged between the cell blocks 18 (on the local-word-driver area 17). The global column-selection line 20 transmits a column address signal comprising a plurality of bits. The row decoder 11 selects one of the row-block selection lines 23 corresponding to the cell blocks 18 to be accessed (only the selected row-block selection line 23 is shown in the figure), and the global column-selection line 20 supplies the column address signal comprising a plurality of bits to the column-selection line 22 via the row-block selection unit 21. The column-selection line 22 is laid out perpendicular to the global column-selection line 20. The column address signal supplied to the column-selection line 22 selectively opens gates connected to the line of the sense amplifiers to couple the selected sense amplifiers to the first data bus 24. The data in the selected sense amplifiers is read out to the first data bus 24, and is supplied to the data-transfer buffer 13. At the time of a data-write operation, on the other hand, data is supplied from the data-transfer buffer 13 to the selected sense amplifiers via the first data bus 24.

In the case of the data-read operation, the data supplied to the data-transfer buffer 13 is output to the second data bus 15. The data on the second data bus 15 is latched by the input/output latch 14, and is output from the device via the input/output lines 30. In the case of the data-write operation, data supplied to the input/output latch 14 via the input/output lines 30 is supplied to the data-transfer buffer 13 via the second data bus 15.

As described above, the DRAM according to the principle of the present invention includes the first data bus 24 for data transfer arranged in parallel to the bit lines across the cell blocks 18 in the memory block 10, with the column-selection line 22 for column selection laid out perpendicularly to the bit lines. With this configuration, the space occupied by the column-selection lines 313 in the prior-art DRAM of FIG. 1 is now used for laying out the first data bus 24 for data transmission. As a result, a number of data transmission lines can be provided for each column of the cell blocks 18.

In the configuration of FIG. 2, one global column-selection line 20 is responsible for the first data bus 24 corresponding to a half of each column of the cell blocks 18 provided on either side of the global column-selection line 20. However, this configuration is not a required feature of the present invention. Alternately, a configuration may be such that one global column-selection line 20 is responsible for the first data bus 24 corresponding to a column of cell blocks provided on one side of the global column-selection line 20, as shown in FIG. 1. The configuration of FIG. 2, however, has an advantage in that the column-selection line 22 extending from the row-block selection unit 21 has a shorter length than that which would be required in the configuration of FIG. 1.

Figure 3:
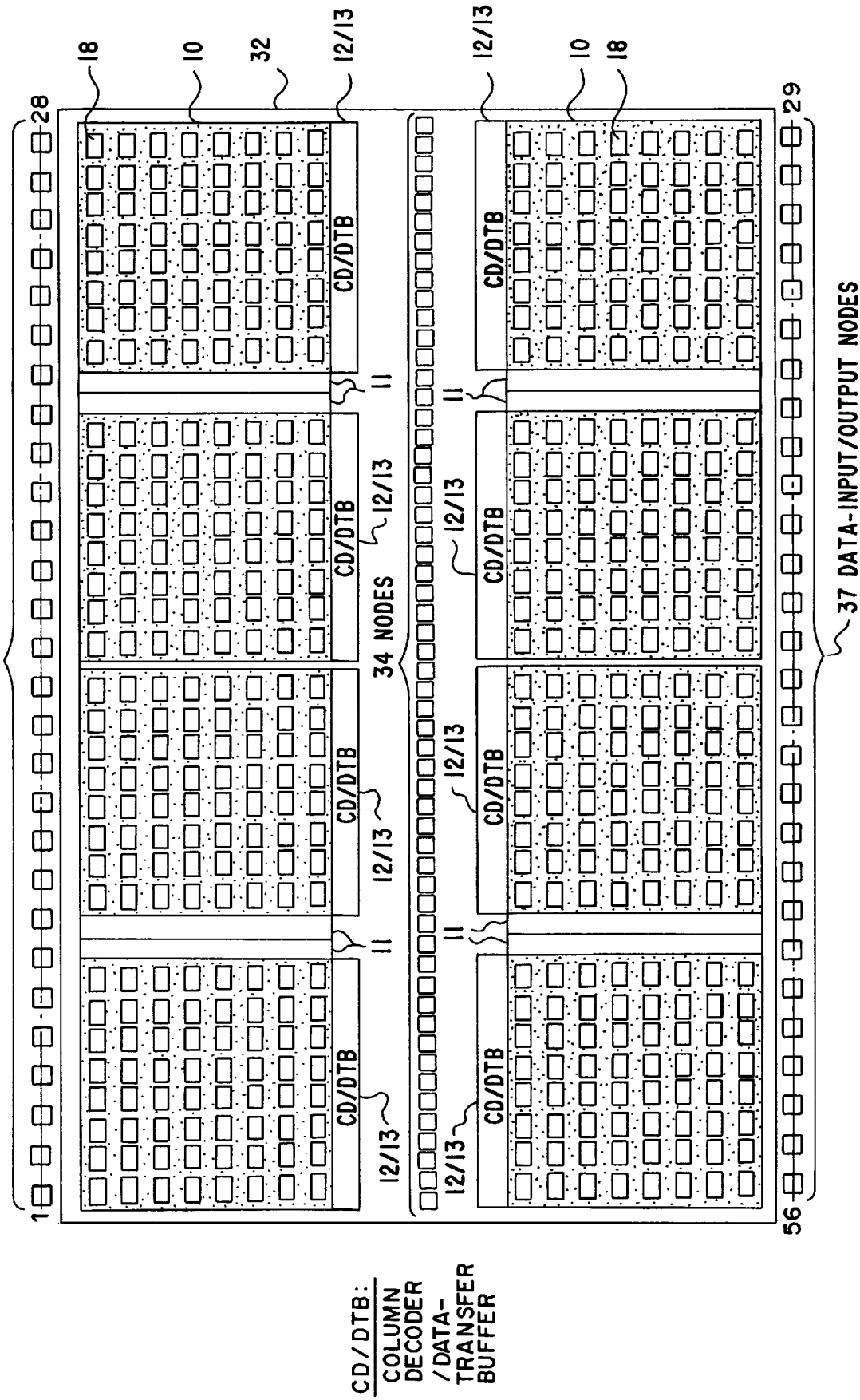
FIG. 3 is an illustrative drawing showing an entire configuration of the DRAM of FIG. 2 according to the present invention.

FIG. 3 is an illustrative drawing showing an entire configuration of the DRAM according to the present invention. In the DRAM of FIG. 3, command/address-input nodes 36 and data-input/output nodes 37 are connected to nodes 34 of a chip 32 by bonding wires or the like. Among the nodes 34, those concerning the data input and output are connected to the data-transfer buffer 13 via the input/output latch 14 and the second data bus 15 (FIG. 2). The input/output latch 14 and the second data bus 15 are omitted from FIG. 3 for the sake of figure clarity. Those relating to the address input among the nodes 34 are connected to the row decoder 11 and the column decoder 12. The row decoder 11 and the column decoder 12 are used for address selection with respect to rows and columns of the cell blocks 18 in the memory block 10 as previously described in connection with FIG. 2.

Figure 4:
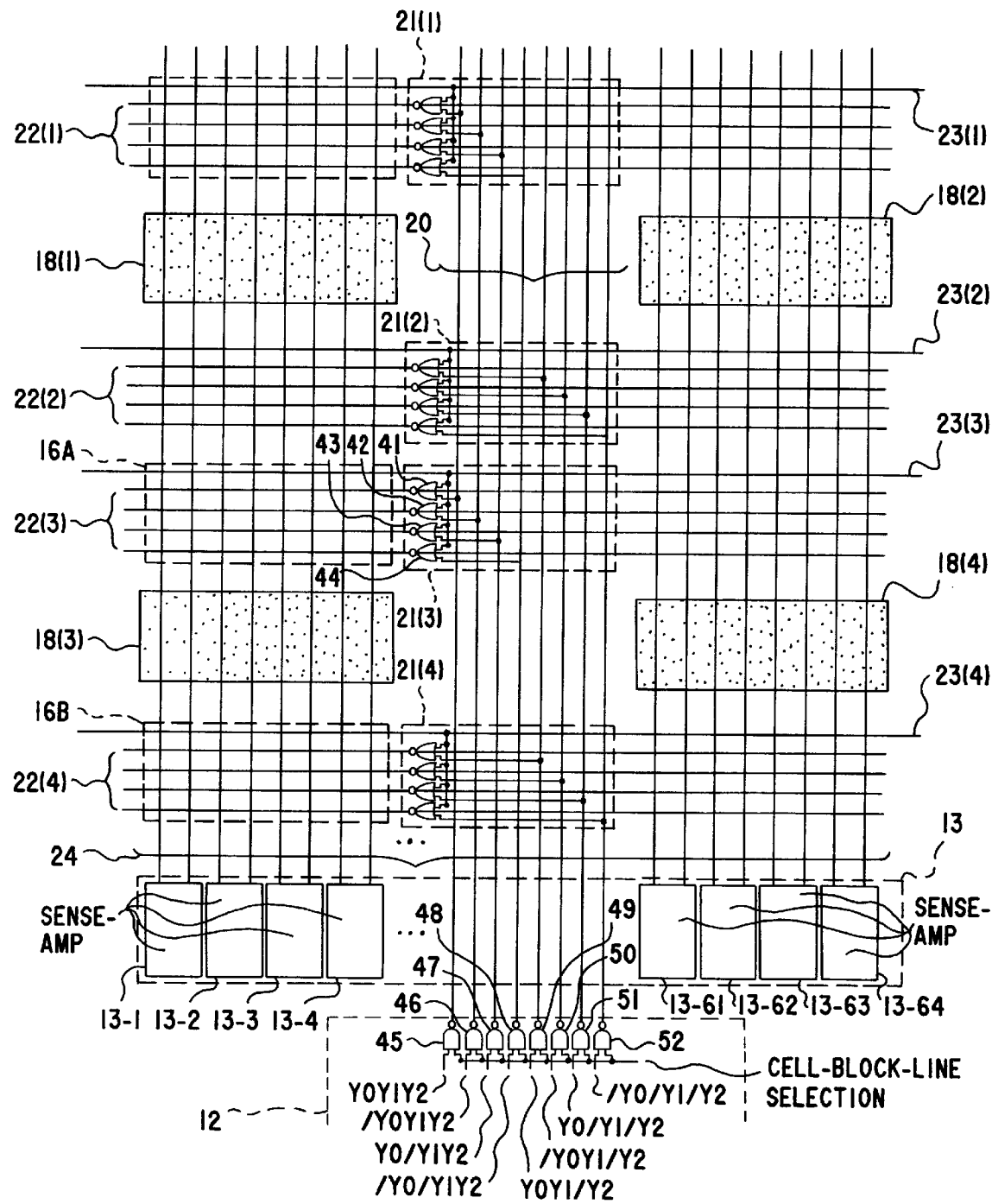
FIG. 4 is an illustrative drawing showing an embodiment of a global column-selection line, a row-block selection unit, a column-selection line, and a row-block selection line shown in FIG. 2.

FIG. 4 is an illustrative drawing showing an embodiment of the global column-selection line 20, the row-block selection unit 21, the column-selection line 22, and the row-block selection line 23 shown in FIG. 2. In FIG. 4, the same elements as those of FIG. 2 are referred to by the same numerals, and numerals in parentheses are used for distinguishing one from others with respect to the elements having the same reference number.

In FIG. 4, row-block selection units 21(1) through 21(4) are arranged in line in a vertical direction. Among those, the row-block selection units 21(1) and 21(2) make a column selection for cell blocks 18(1) and 18(2). On the other hand, the row-block selection units 21(3) and 21(4) are used for carrying out a column selection for cell blocks 18(3) and 18(4). When the cell blocks 18(1) and 18(2) in the same row are to be selected, for example, both row-block selection lines 23(1) and 23(2) should be selected. In FIG. 2, only one row-block selection line 23 is provided to select one row of the cell blocks 18. In the embodiment of FIG. 4, however, two row-block selection lines 23, one placed above and the other placed below a given row, are selected to chose the given row.

The column decoder 12 includes NAND circuits 45 through 52. The NAND circuits 45 through 52 receive at one input thereof column-selection signals Y0Y1Y2 through /Y0/Y1/Y2, which are obtained by decoding three bits of the six bits Y0, Y1, Y2, Y3, Y4, and Y5 representing an entire column address. Also, the NAND circuits 45 through 52 receive at the other input thereof a cell-block-line selection signal. With the cell-block-line selection signal being HIGH, the NAND circuits 45 through 52 output an inverse of the column-selection signals Y0Y1Y2 through /Y0/Y1/Y2 to the global column-selection lines 20 (collectively shown as one line in FIG. 2). As a result, only one of the eight global column-selection lines 20 becomes LOW.

Taking the row-block selection unit 21(3) as an example to explain the configuration of the row-block selection unit 21, the row-block selection unit 21(3) includes NOR circuits 41 through 44. The NOR circuits 41 through 44 receive at one input thereof the row-block selection line 23(3), and receive at the other input thereof the four global column-selection lines 20 corresponding to the column-selection signals Y0Y1Y2 through /Y0/Y1Y2. Each of the row-block selection units 21(1), 21(2), and 21(4) is also comprised of NOR circuits in the same manner.

In the following, a description will be provided by taking a selection of the cell blocks 18(3) and 18(4) as an example. When the cell blocks 18(3) and 18(4) are selected, the row-block selection lines 23(3) and 23(4) are turned to LOW. Other row-block selection lines 23 remain at a HIGH level. When the global column-selection line 20 corresponding to the column-selection signal Y0Y1Y2 is LOW, for example, the NOR circuit 41 receives LOW signals at both inputs. The NOR circuit 41 thus has a HIGH output. Outputs of other NOR circuits 42 through 44 are LOW. Namely, only one of the four column-selection lines 22(3) is turned to HIGH while all the other column-selection lines 22(1), 22(2), and 22(4) remain at a LOW level.

In this manner, the column-selection signal from the column decoder 12 is supplied to the column-selection line 22 selected by the row-block selection line 23. Namely, among eight column-selection lines 22 provided for a selected row of the cell blocks 18, only one column-selection line 22 is selected to become HIGH.

In the example of FIG. 4, the global column-selection lines 20 are shown as eight lines for transmitting decoded column-selection signals Y0Y1Y2 through /Y0/Y1/Y2. However, the global column-selection lines 20 may comprise three lines for transmitting column-address signals Y0, Y1, and Y2 prior to the decoding operation. In this case, the row-block selection unit 21 may be provided with a decoding function to decode the column-address signals Y0, Y1, and Y2.

As previously described in connection with FIG. 2, the column-address signal (column-selection signal) transmitted via the column-selection line 22 selectively opens the gates which are connected to the sense amplifiers in the sense-amplifier area. Through the open gates, the selected sense amplifiers are connected to the first data bus 24. During the data-read operation in FIG. 4, for example, the data supplied to the first data bus 24 is provided to sense amplifiers 13-1 through 13-64 of the data-transfer buffer 13. In this example, therefore, the first data bus 24 transmits 64 bits (via 64 pairs of signal lines).

In what follows, a circuit for connecting the selected sense amplifiers in the sense-amplifier area to the first data bus 24 will be described.

Figure 5:
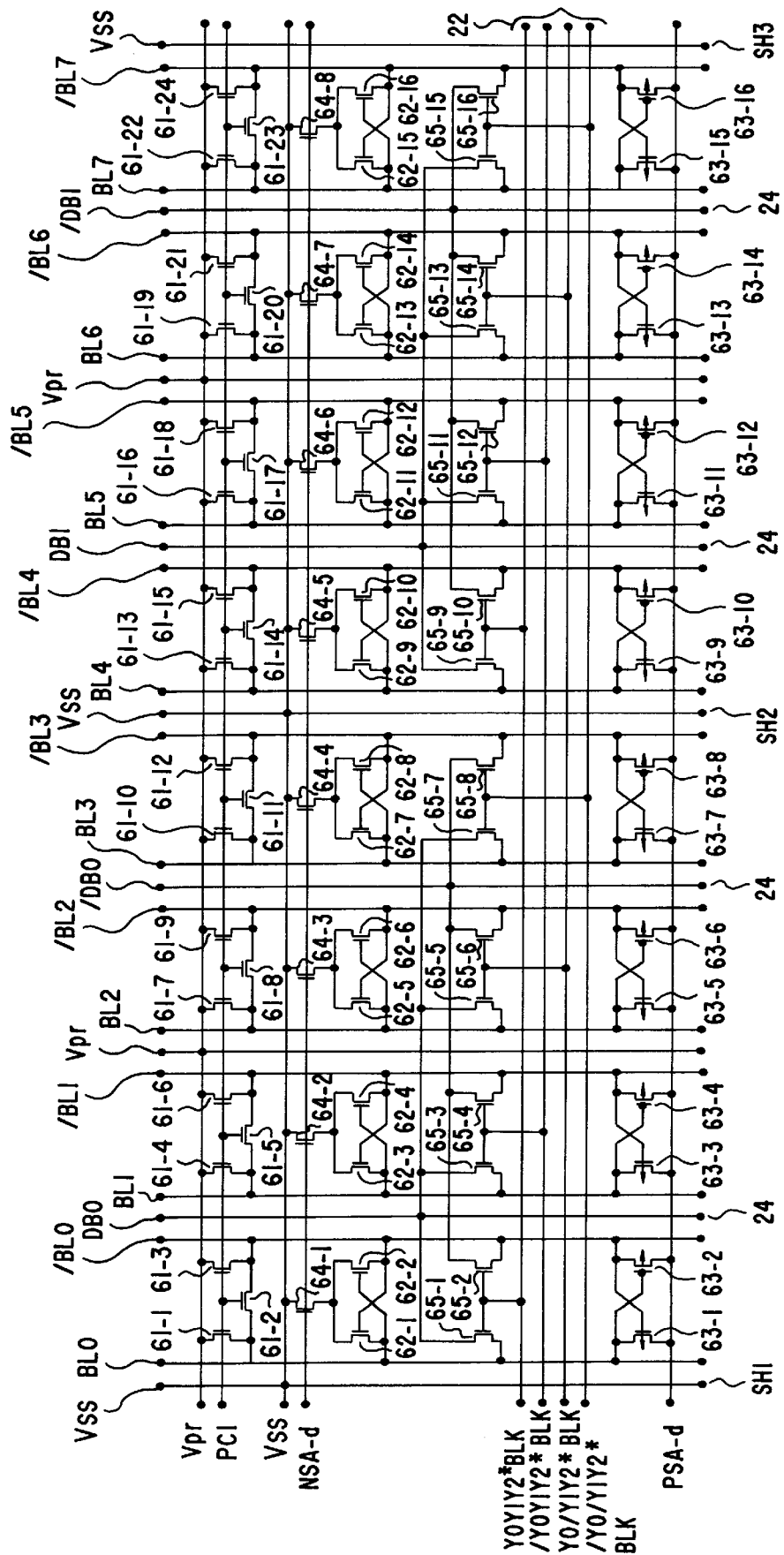
FIG. 5 is a circuit diagram of an embodiment of sense amplifiers in a sense-amplifier area, the column-selection line, and a first data bus of FIG. 4.

FIG. 5 is a circuit diagram of an embodiment of the sense amplifiers in the sense-amplifier area, the column-selection line 22, and the first data bus 24. The column-selection lines 22 of FIG. 5 correspond to the column-selection lines 22(3) of FIG. 4, for example. Namely, FIG. 5 shows a sense-amplifier area 16A of FIG. 4, in which the column-selection lines 22 transmit the column-selection signals Y0Y1Y2 through /Y0/Y1Y2.

In FIG. 5, the column-selection signals are represented by symbols Y0Y1Y2*BLK through /Y0/Y1Y2*BLK. This indicates that these column-selection signals are selected by a signal BLK on the row-block selection line 23.

In FIG. 5, the sense amplifiers in the sense-amplifier area includes NMOS transistors 62-1 through 62-16 and PMOS transistors 63-1 through 63-16. The NMOS transistors 62-1 and 62-2 and the PMOS transistors 63-1 and 63-2, for example, together make up one sense amplifier. The NMOS transistors 62-3 and 62-4 and the PMOS transistors 63-3 and 63-4 together make up another sense amplifier, and so on. In FIG. 5, eight sense amplifiers are shown in total. NMOS transistors 64-1 through 64-8 are transistors for driving the sense amplifiers. With a signal NSA-d being HIGH, the NMOS transistors 64-1 through 64-8 are turned on to allow a current to flow through the sense amplifiers. At the same time, a signal PSA-d becomes HIGH to provide the current to the sense amplifiers. The current flowing through the sense amplifiers is directed toward a low voltage Vss.

Each of the sense amplifiers is connected to a pair of bit lines. A pair of bit lines BL0 and /BL0, for example, is connected to the sense amplifier comprising the NMOS transistors 62-1 and 62-2 and the PMOS transistors 63-1 and 63-2. In FIG. 5, eight pairs of bit lines BL0 and /BL0 through BL7 and /BL7 are shown. These eight pairs of bit lines are connected to the eight sense amplifiers mentioned in the above.

NMOS transistors 61-1 through 61-24 are provided for short-circuiting and pre-charging the bit lines. When a pre-charge signal PC1 is HIGH, the NMOS transistors 61-1 through 61-24 are all turned on. As a result, all the pairs of bit lines are charged at a voltage level Vpr, and bit lines of each pair are short-circuited with each other to ensure an equal voltage level. For example, with the pre-charge signal PC1 being HIGH, the NMOS transistors 61-1 and 61-3 are turned on to charge the bit lines BL0 and /BL0 to the voltage level Vpr, and the NMOS transistor 61-2 is switched on to short-circuit the bit lines BL0 and /BL0 with each other, ensuring the equal voltage level.

NMOS transistors 65-1 through 65-16 are provided for connecting the first data bus 24 with the sense amplifiers selected by the column-selection line 22. In FIG. 5, two pairs of the first data bus DB0 and /DB0 and DB1 and /DB1 are shown. When the column-selection signal Y0Y1Y2*BLK is HIGH, for example, the NMOS transistors 65-1 and 65-2 are turned on. As a result, the bit line BL0 is coupled to the first data bus DB0, and the bit line /BL0 is coupled to the first data bus /DB0. In this manner, data which is amplified by the sense amplifier on the bit lines BL0 and /BL0 is supplied to the first data bus DB0 and /DB0.

The first data bus DB0 and /DB0 is coupled to one pair selected from the four pairs of bit lines BL0 and /BL0 through BL3 and /BL3. The first data bus DB1 and /DB1 is coupled to one pair selected from the four pairs of bit lines BL4 and /BL4 through BL7 and /BL7. The selection of bit-line pairs is made by the column-selection signals Y0Y1Y2*BLK through /Y0/Y1Y2*BLK on the column-selection lines 22, as previously described. In the example of FIG. 5, one pair is selected from four pairs of bit lines to be connected to the first data bus 24.

The sense-amplifier area of FIG. 5 corresponds to the sense-amplifier area 16A of FIG. 4. The column-selection signals supplied to the sense-amplifier area 16A represent only four bits of the total eight bits. The remaining four bits are supplied to a sense-amplifier area 16B shown in FIG. 4. In the same manner as in the sense-amplifier area 16A, when one bit of the four bits of the column-selection signals is turned into HIGH in the sense-amplifier area 16B, one pair is selected from four pairs of bit lines and connected to the first data bus 24. The four pairs of bit lines subjected to a selection of one pair are different between the sense-amplifier area 16A and the sense-amplifier area 16B. In this example, each of the four bits of the column-selection lines 22(4) is unselected when one bit is selected from the four bits of the column-selection line 22(3). In the configuration of FIG. 4 and FIG. 5, therefore, only one pair is selected from the eight pairs of bit lines to be connected to the first data bus 24.

In FIG. 5, shield lines SH1 through SH3 are provided in parallel to the first data bus 24 (DB0 and /DB0 and DB1 and /DB1). These shield lines SH1 through SH3 are connected to the power voltage level Vss, so that cross talk and the like is suppressed between pairs of the first data bus 24.

In FIG. 5, the driver transistors (NMOS transistors 64-1 through 64-8) for driving the sense amplifiers are provided, one each for a respective sense amplifier. Alternately, these driver transistors may be provided such that a common driver transistor drives a plurality of sense amplifiers. It is not preferable, however, to provide only one driver transistor for all the sense amplifiers of FIG. 5 and to lay out a line for connecting this driver transistor to each of the sense amplifiers in place of the power line of the voltage Vss of FIG. 5. This is because such a configuration creates a lengthy line for connecting the driver transistor to the sense amplifiers, and results in a large resistance through this line. Since this line carries a large amount of current, the combination of the large resistance and the large current will result in a higher voltage at the positions of the sense amplifiers. To avoid this, the number of sense amplifiers connected to one driver transistor should be as small as possible.

Figure 6:
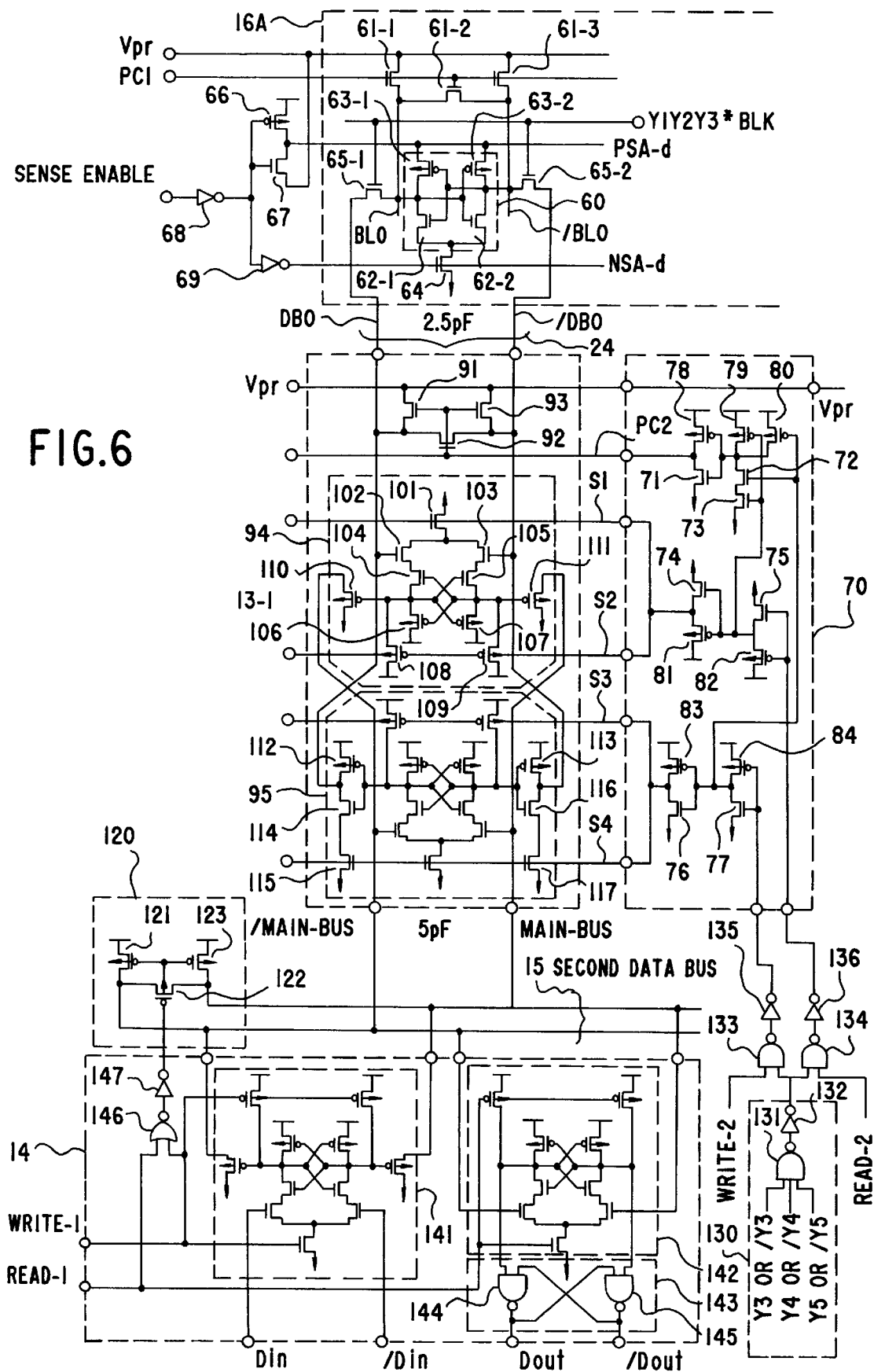
FIG. 6 is a circuit diagram of an embodiment of a sense amplifier in the sense-amplifier area, a sense amplifier of a data-transfer buffer, a second data bus, an input/output latch, and other relevant portions.

FIG. 6 is a circuit diagram of an embodiment of a sense amplifier in the sense-amplifier area, a sense amplifier of the data-transfer buffer 13, the second data bus 15, the input/output latch 14, and other relevant portions. In FIG. 6, the same elements as those of FIG. 2, FIG. 4, and FIG. 5 are referred to by the same numerals, and a description thereof will be omitted.

At the top of FIG. 6 is shown a portion of the sense-amplifier area 16A in FIG. 4, i.e., the pair DB0 and /DB0 of the first data bus 24, the bit lines BL0 and /BL0 connected to the first data bus 24, and other relevant circuits. In FIG. 6, the sense amplifier comprised of the NMOS transistors 62-1 and 62-2 and the PMOS transistors 63-1 and 63-2 in FIG. 5 is designated by reference numeral 60.

A circuit comprised of a PMOS transistor 66, an NMOS transistor 67, and inverters 68 and 69 generates the driving signals PSA-d and NSA-d for driving the sense amplifiers as described in connection with FIG. 5. A signal SenseEnable is turned to HIGH to activate the driving signals PSA-d and NSA-d.

The pair DB0 and /DB0 of the first data bus 24 extends from the sense-amplifier area 16A to the sense amplifier 13-1 of the data-transfer buffer 13 (see FIG. 4). As shown in FIG. 6, the sense amplifier 13-1 includes NMOS transistors 91 through 93, a read amplifier 94, and a write amplifier 95. The NMOS transistors 91 through 93 are used for pre-charging and short-circuiting the pair DB0 and /DB0 of the first data bus 24. When the pre-charge signal PC2 is HIGH, the NMOS transistors 91 through 93 are turned on, so that the data-bus lines DB0 and /DB0 are charged to the voltage Vpr and short-circuited with each other.

The read amplifier 94 receives amplifier driving signals S1 and S2, and the write amplifier 95 receives amplifier driving signals S3 and S4. These amplifier driving signals S1 through S4 as well as the pre-charge signal PC2 are generated by a signal generating circuit 70.

The signal generating circuit 70 operates only when the sense amplifier 13-1 is selected from the sense amplifiers 13-1 through 13-64 of the data-transfer buffer 13 (see FIG. 4).

The selection of the sense amplifier is made by a decoder 130. The decoder 130 includes a NAND circuit 131 and an inverter 132, and decodes the three bits Y3, Y4, and Y5 of the six bits Y0, Y1, Y2, Y3, Y4, and Y5 representing the column address. In the example of FIG. 6, the decoder 130 produces a HIGH output when the three bits Y3, Y4, and Y5 are all HIGH. (Alternately, a negative logic may be used.)

At the time of the data-read operation, the output of the decoder 130 and a read signal Read-2 are HIGH, so that an NAND circuit 134 outputs a LOW signal to turn an output of an inverter 136 to HIGH. A write signal Write-2 is LOW in this case, so that an inverter 135 outputs a LOW signal.

At the time of the data-write operation, the output of the decoder 130 and the write signal Write-2 are HIGH, so that a NAND circuit 133 outputs a LOW signal to turn the output of the inverter 135 to HIGH. The read signal Read-2 is LOW in this case, so that the inverter 136 outputs a LOW signal.

During the pre-charge operation, both the write signal Write-2 and the read signal Read-2 are LOW. The inverters 135 and 136 in this case produce LOW outputs.

The outputs of the inverters 135 and 136 are supplied to the signal generating circuit 70. The signal generating circuit 70 includes NMOS transistors 71 through 77 and PMOS transistors 78 through 84.

A circuit comprised of the NMOS transistors 76 and 77 and the PMOS transistors 83 and 84 makes up two-stage inverters, and turns the amplifier driving signals S3 and S4 to HIGH when the output of the inverter 135 is HIGH. When the output of the inverter 135 is LOW, on the other hand, the amplifier driving signals S3 and S4 become LOW. As previously described, the output of the inverter 135 becomes HIGH only when the operation is a write operation. Namely, the amplifier driving signals S3 and S4 are turned to HIGH only during a write operation.

A circuit comprised of the NMOS transistors 74 and 75 and the PMOS transistors 81 and 82 makes up two-stage inverters, and turns the amplifier driving signals S1 and S2 to HIGH when the output of the inverter 136 is HIGH. When the output of the inverter 136 is LOW, on the other hand, the amplifier driving signals S1 and S2 become LOW. As previously described, the output of the inverter 136 becomes HIGH only when the operation is a read operation. Namely, the amplifier driving signals S1 and S2 are turned to HIGH only during a read operation.

A circuit comprised of the NMOS transistors 71 through 73 and the PMOS transistors 78 through 80 forms an AND circuit (a NAND circuit and an inverter in a series connection), and turns the pre-charge signal PC2 to HIGH only when two inputs thereto are HIGH. Since these two inputs are inverts of the write signal Write-2 and the read signal Read-2, the pre-charge signal PC2 becomes HIGH when the operation is neither a write operation nor a read operation.

The read amplifier 94 operates when both the amplifier driving signals S1 and S2 are HIGH, and amplifies data on the data bus DB0 and /DB0 to supply it to the second data bus 15. The read amplifier 94 includes NMOS transistors 101 through 105 and PMOS transistors 106 and 111. The NMOS transistor 101 is a transistor for driving the read amplifier 94, and is turned on to drive the amplifier when the amplifier driving signal S1 is HIGH. The PMOS transistors 108 and 109 are provided in order to turn off the PMOS transistors 110 and 111 when the amplifier driving signal S2 is LOW, i.e., during a period other than a read operation. These PMOS transistors 110 and 111 are used for supplying the amplifier output to the second data bus 15. Other configurations are the same as a conventional amplifier, and a description thereof will be omitted.

The write amplifier 95 operates when the amplifier driving signals S3 and S4 are HIGH, and amplifies data on the second data bus 15 to supply it to the data bus DB0 and /DB0. The write amplifier 95 has an identical configuration to that of the read amplifier 94, except that the PMOS transistors 110 and 111 in the read amplifier 94 for outputting data are replaced by PMOS transistors 112 and 113 and NMOS transistors 114 through 117. Because of such an identical configuration, a further description of the write amplifier 95 will be omitted.

In FIG. 6, the input/output latch 14 includes an input amplifier 141, an output amplifier 142, an output-data-latch circuit 143, a NOR circuit 146, and an inverter 147.

The input amplifier 141 receives data from data-input nodes Din and /Din, and supplies the data to the second data bus 15 after amplification. A configuration of the input amplifier 141 is the same as that of the read amplifier 94, and a description thereof will be omitted.

The output amplifier 142 receives data from the second data bus 15, and supplies the data to the output-data-latch circuit 143 after amplification. The output amplifier 142 has a conventional configuration, and a description thereof will be omitted.

The output-data-latch circuit 143 includes NAND circuits 144 and 145 forming a flip-flop. The output-data-latch circuit 143 holds data supplied from the output amplifier 142, and outputs the data from data-output nodes Dout and /Dout.

The input amplifier 141 operates when the write signal Write-1 is HIGH, whereas the output amplifier 142 works when the read signal Read-1 is HIGH. The NOR circuit 146 and the inverter 147 obtain a logical sum of the write signal Write-1 and the read signal Read-1, and provides this logical sum to a pre-charge circuit 120.

The pre-charge circuit 120 is provided for the purpose of pre-charging and short-circuiting the second data bus 15. The pre-charge circuit 120 includes PMOS transistors 121 through 123, and pre-charges and short-circuits the second data bus 15 when the logical sum between the write signal Write-1 and the read signal Read-1 is LOW. That is, the pre-charge circuit 120 carries out the pre-charge operation during a period which is neither a write-operation period nor a read-operation period.

As described in the above, the configuration of FIG. 4 selects the column-selection line 22, and the configuration of FIG. 5 connects bit lines of the selected column to the first data bus 24, before the configuration of FIG. 6 finally selects a sense amplifier of the data-transfer buffer 13 to connect the selected first data bus 24 to the second data bus 15. These operations allows data on the bit lines to be transferred to the second data bus 15, or allows data on the second data bus 15 to be transferred to the bit lines. Namely, the configurations of FIG. 4 through FIG. 6 can implement the DRAM according to the principle of the present invention shown in FIG. 2.

As can be understood from the previous description, the three bits Y0, Y1, and Y2 of the column address select a pair from the eight pairs of bit lines, and the selected pair is coupled to the first data bus 24, while the remaining three bits Y3, Y4, and Y5 of the column address selects a pair from the eight pairs of first data bus 24 to connect the selected pair to the second data bus 15. If 2048 bits are represented by the bit lines, the output of the data-transfer buffer 13 should represent 32 bits (2048/64). Since a sufficient number of the first data bus 24 is prepared for representing 256 bits (2048/8), data up to 256 bits can be supplied to the second data bus 15 with an adjustment of the ratio of the sense amplifier selection in the data-transfer buffer 13.

FIGS. 7A through 7J are timing charts showing the data transfer from the bit lines to the second data bus 15 at the time of a data-read operation. In connection with FIG. 4 and FIG. 6, FIGS. 7A through 7J show the sense-amplifier driving signal Sense Enable, the bit-line signal, the signal on the row-block selection line 23, the signal on the global column-selection line 20, the signal on the first data bus 24, the read signal Read-2, the output signal of the read amplifier 94, the signal on the second data bus 15, the read signal Read-1, and the output signal of the output amplifier 142, respectively.

The signal on the row-block selection line 23, the signal on the global column-selection line 20, the signal on the first data bus 24, and the signal on the second data bus 15 may have a variation in signal timing depending on which column is selected. In FIGS. 7A through 7J, a plurality of lines at rising edges and falling edges of the signals represent this variation in signal timing.

Figure 7:
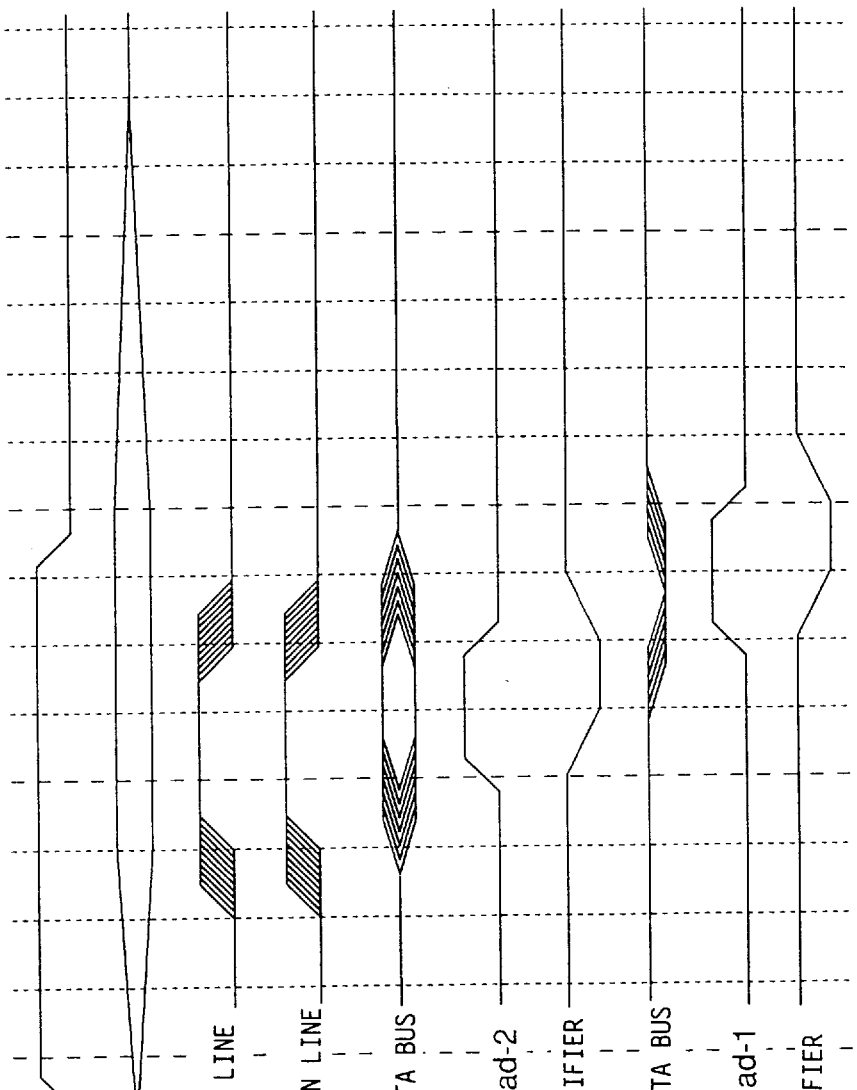
FIGS. 7A through 7J are timing charts showing data transfer from bit lines to the second data bus at the time of a data-read operation.

As shown in FIGS. 7A and 7B, a signal appears on a bit line at the same time as the signal SenseEnable, as the signal SenseEnable drives the sense amplifier 60. After this, the row-block selection line 23 and the global column-selection line 20 are simultaneously activated as shown in FIGS. 7C and 7D, resulting in a signal of the selected bit line appearing on the first data bus 24 as shown in FIG. 7E. The signal on the first data bus 24 is supplied to the read amplifier 94 at a timing indicated by the read signal Read-2 (FIG. 7F). In response, a signal is output from the read amplifier 94 as shown in FIG. 7G, and is propagated to the second data bus 15 as in FIG. 7H. The signal on the second data bus 15 is supplied to the output amplifier 142 at the timing indicated by the read signal Read-1 (FIG. 7I). In response, the output amplifier 142 outputs a signal as shown in FIG. 7J.

FIGS. 8A through 8I are timing charts showing the data transfer from the second data bus 15 to the bit lines at the time of a data-write operation. In connection with FIG. 4 and FIG. 6, FIGS. 8A through 8I show the write signal Write-1, the signal on the second data bus 15, the input signal to the write amplifier 95, the write signal Write-2, the signal on the first data bus 24, the signal on the global column-selection line 20, the signal on the row-block selection line 23, the bit-line signal, and the sense-amplifier driving signal SenseEnable, respectively.

In the same manner as in FIGS. 7A through 7J, a plurality of lines at rising edges and falling edges of the signals in FIGS. 8A through 8I represent a variation in signal timing.

Figure 8:
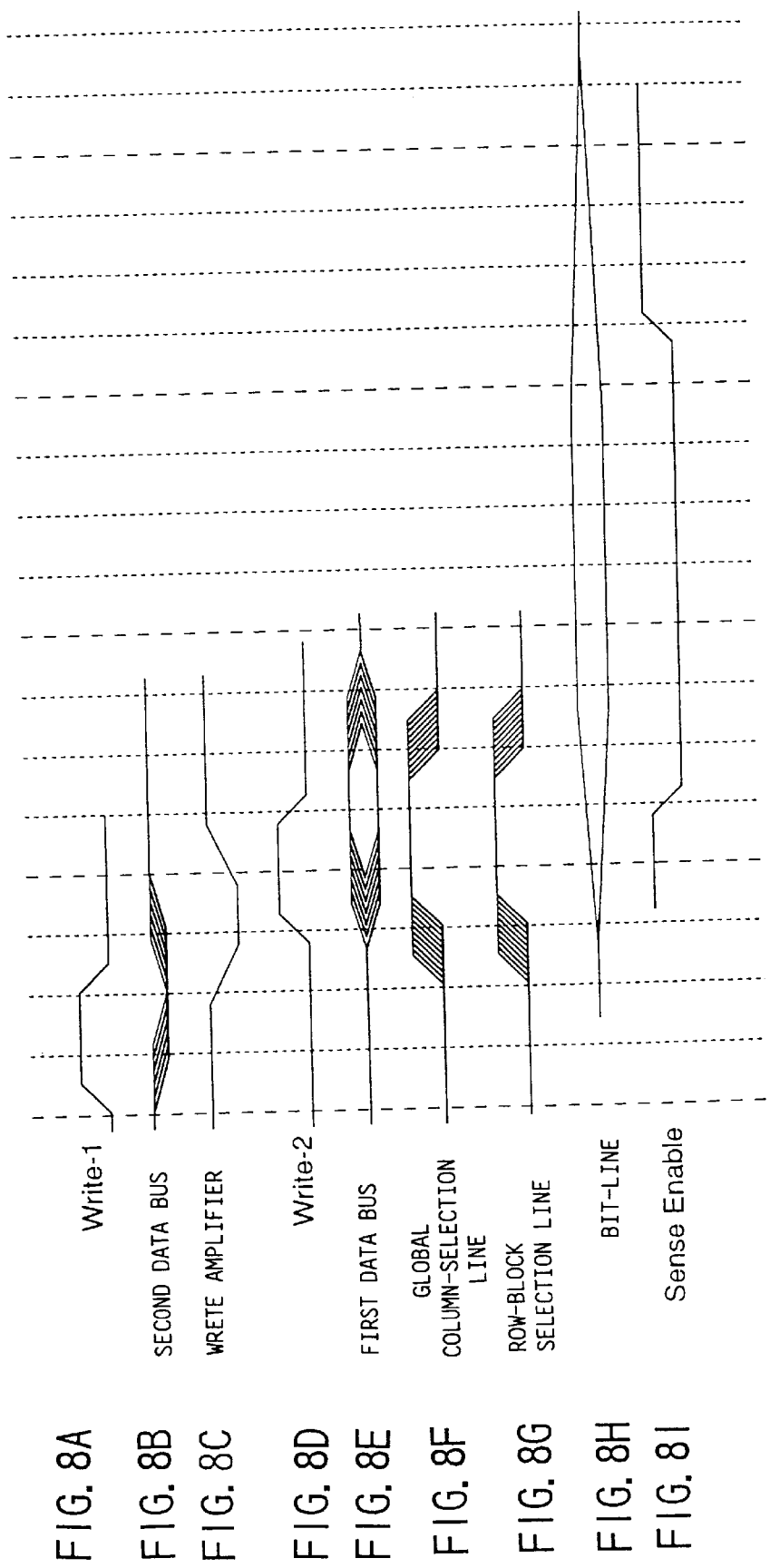
FIGS. 8A through 8I are timing charts showing data transfer from the second data bus to the bit lines at the time of a data-write operation.

As shown in FIGS. 8A and 8B, a signal is transmitted to the second data bus 15 at the timing of the write signal Write-1. The signal on the second data bus 15 is input to the write amplifier 95, which operates at the timing of the write signal Write-2 to output a signal on the first data bus 24 (FIGS. 8C through 8E). The global column-selection line 20 and the row-block selection line 23 are activated at the same timing as shown in FIGS. 8F and 8G, resulting in the signal on the first data bus 24 being transferred to the selected bit line (FIG. 8H). After this, the signal SenseEnable is activated as shown in FIG. 8I to drive the sense amplifier to amplify the bit-line.

Variations may be made to the embodiment described above.

The configuration of FIG. 6 incurs large power consumption for transferring a large number of data bits. To address this problem, a reduction may be made to the amplitude of the data signals on the first data bus 24 and/or the second data bus 15 so as to suppress the power consumption. To this end, transistors having a narrower gate width may be used for outputting signals to the data bus from the sense amplifiers or the like. In FIG. 6, specifically, a gate width is narrowed with respect to the NMOS transistors 65-1 and 65-2 for outputting a signal to the first data bus 24 at the time of a data-read operation. Also, a gate width of the PMOS transistors 110 and 111 is narrowed to output a signal to the second data bus 15 during a data-read operation. Further, among the PMOS transistors 112 and 113 and the NMOS transistors 114 through 117 for outputting a signal to the first data bus 24 during a data-write operation, at least one of the three transistors in a series connection is provided with a narrowed gate width. Finally, the PMOS transistors in the input amplifier 141 for outputting a signal to the second data bus 15 at the time of a data-write operation is provided with a narrowed gate width.

With these narrowed gate width, the transistors do not exhibit rapid changes in the output current and output voltage thereof. If signal changes synchronized with the clock signal are relatively fast compared to the changes in the output current and voltage of these transistors, the pre-charge operation and the short-circuit operation will be conducted before the signals attain their maximum amplitude. As a result, a signal amplitude decreases with a decrease in the gate width.

During the data-read operation, a voltage difference between bit lines forming a pair is about 200 mV. Normally, this voltage is amplified to be supplied to the data bus. In this variation of a narrowed gate width, however, a voltage difference between a pair of signal lines of the first data bus 24 may be about 200 mV, and a voltage difference between a pair of signal lines of the second data bus 15 may be about 400 mV.

During the data-write operation, an input to the input amplifier 141 has a voltage difference of about 3.3 V between a pair of signal lines, for example. In this case, the voltage difference between a pair of signal lines may be about 400 mV with respect to the second data bus 15, and is back to 3.3 V with respect to the first data bus 24. Alternately, the signal on the first data bus 24 may also have a reduced signal amplitude during the data-write operation.

The use of reduced-amplitude signals on the internal data buses in DRAMs is preferable because it can avoid excessive power consumption even when a large number of data bits are transferred by activating a large number of data bus lines.

Another variation concerns the circuit of the sense amplifier area (FIG. 5). In this variation, the driver transistors for driving the sense amplifiers are provided, one each for a unit of column redundancy. The column redundancy means that when a pair of data-bus lines (the first data bus 24) suffers a defect from poor manufacturing and is incapable of normal operations, an address corresponding to the defective pair is reallocated to another pair of the data bus by changing fuse connections or the like before shipment of the product. By conducting this column redundancy, manufacturer can ensure error-free access to all the addresses of the memory.

Figure 9:
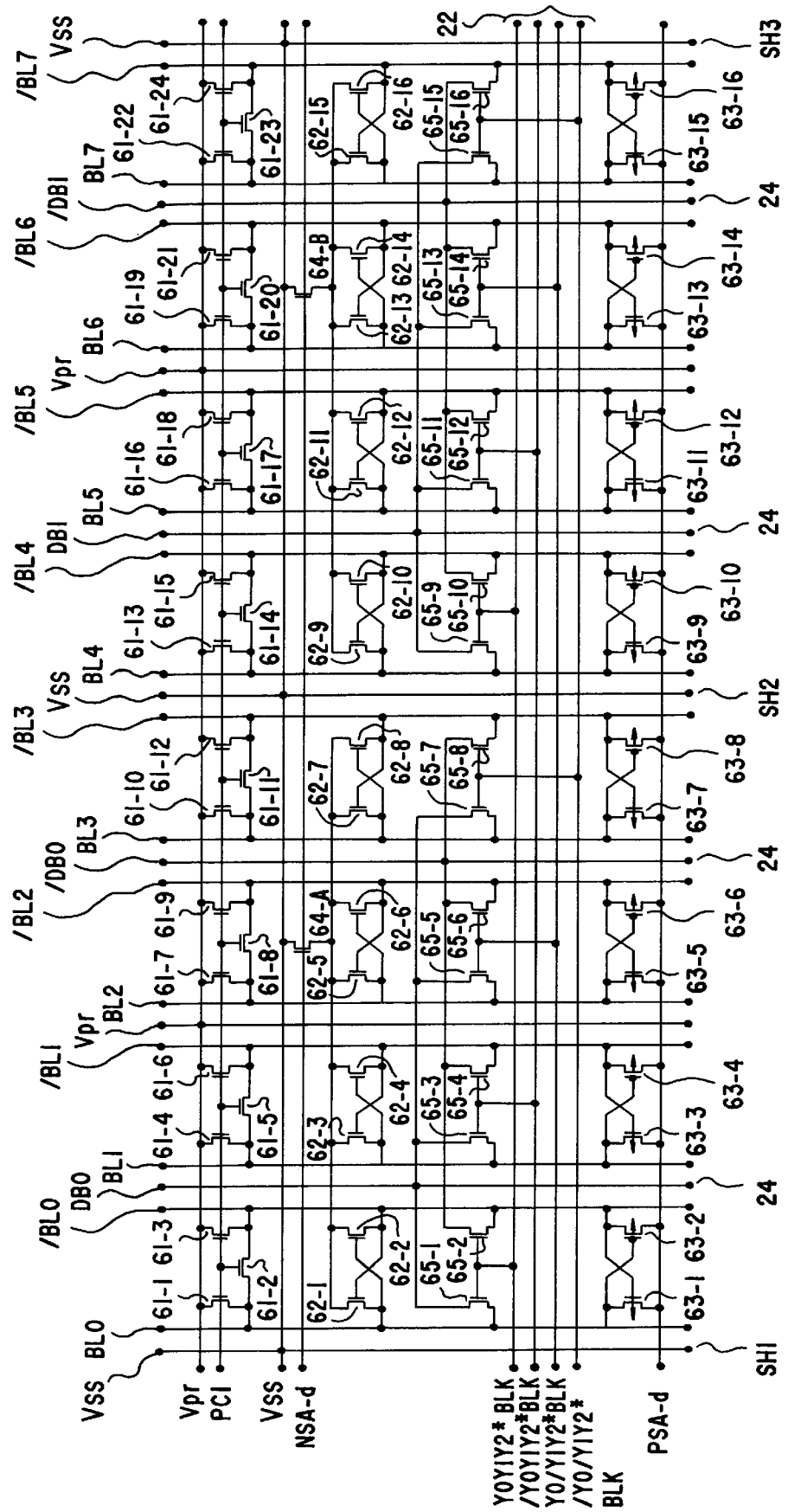
FIG. 9 is a circuit diagram of a circuit in which a driver transistor for driving the sense amplifiers is provided for each unit of column redundancy.

FIG. 9 is a circuit diagram of a circuit in which a driver transistor for driving the sense amplifiers is provided for each unit of column redundancy. In FIG. 9, the same elements as those of FIG. 5 are referred to by the same numerals, and a description thereof will be omitted. In FIG. 9, a driver transistor 64-A is provided for the sense amplifiers connected to the data-bus pair DB0 and /DB0, and a driver transistor 64-B is provided for the sense amplifiers connected to the data-bus pair DB1 and /DB1. In this example, the column redundancy is conducted data-bus pair by data-bus pair.

In view of column redundancy in DRAMs, a driver transistor is preferably provided for each unit of the column redundancy. Such a configuration is advantageous when there is a need to replace a defective portion with another portion, because the replacement is easily made by disconnecting a driver transistor of the defective portion and connecting a driver transistor of the replacement portion. The column redundancy does not have to be conducted data-bus pair by data-bus pair, but may be conducted by a larger unit. Even in such a case, it is preferable to provide a driver transistor for each unit of the column redundancy, rather than for each data-bus pair.

Another variation concerns provision of two types of data buses used as the second data bus 15, one for a data-read operation and the other for a data-write operation.

Figure 10:
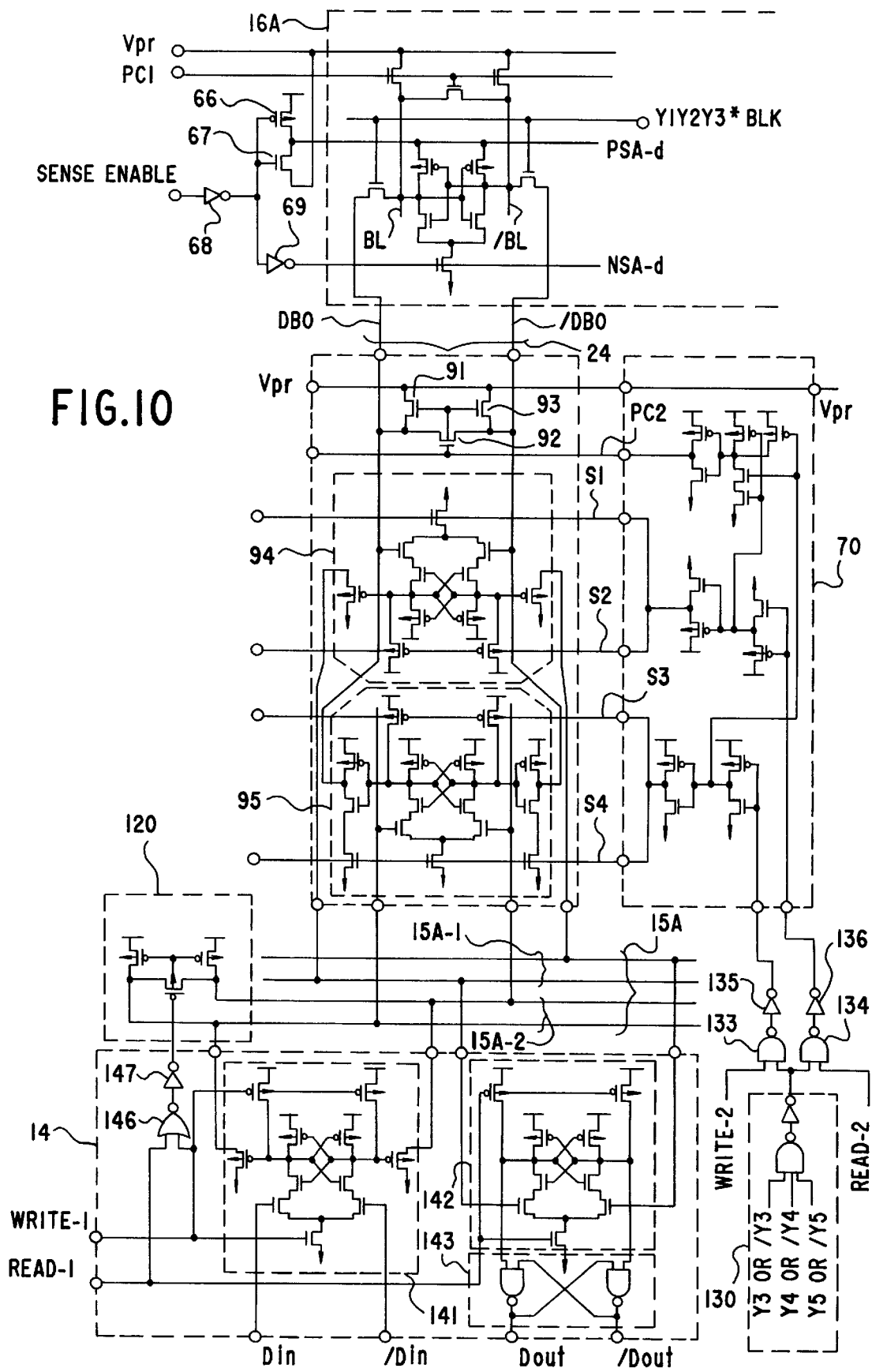
FIG. 10 is a circuit diagram of the sense amplifiers in the sense-amplifier area, the sense amplifiers in the data-transfer buffer, the second data bus, the input/output latch, and other relevant circuits when the two types of the second data bus are provided.

FIG. 10 is a circuit diagram of the sense amplifiers in the sense-amplifier area, the sense amplifiers in the data-transfer buffer 13, the second data bus 15, the input/output latch 14, and other relevant circuits when the two types of the second data bus 15 are provided. In FIG. 10, the same elements as those of FIG. 6 are referred to by the same numerals, and a description thereof will be omitted.

The second data bus 15A of FIG. 10 includes a read-purpose bus 15A-1 and a write-purpose bus 15A-2. The read-purpose bus 15A-1 is connected to the read amplifier 94 and the output amplifier 142, and the write-purpose bus 15A-2 is connected to the write amplifier 95 and the input amplifier 141. The read amplifier 94, the write amplifier 95, the input amplifier 141, and the output amplifier 142 are the same as those of FIG. 6, except that these are connected to either the read-purpose bus 15A-1 or the write-purpose bus 15A-2.

Provision of the two types of the second data bus 15A, one for the read purpose and the other for the write purpose, attains the following advantage. When an operation is switched from a read operation to a write operation, for example, the write-purpose bus 15A-2 can be pre-charged in advance during the read operation so as to be prepared for write-data transfer, thereby saving the time required for the pre-charge operation. In this manner, the two types of buses can achieve high-speed data transfer. Also, it is obvious that the same applies when two types of buses are provided for the first data bus 24.

In the embodiments described above, operations of the row decoder 11 and a timing of the row-block selection signal on the row-block selection line 23 have not been described. As previously described, the row-block selection line 23 is used for connecting the global column-selection line 20 to the column-selection line 22 corresponding to a selected row when the global word line 25 selects one row from the cell blocks 18. In such a configuration, data-read operations can be conducted with the same timings as those of conventional DRAMs. However, the row-block selection line 23 can make a selection of a row block (one row of the cell blocks 18) in a manner similar to a bank-interleave operation so as to enhance the memory operation speed. Here, the bank-interleave operation is a technique which is employed in related-art DRAMs to switch banks rather than row blocks to enhance the memory operation speed.

FIGS. 11A through 11Z and 11a through 11g are timing charts for explaining high-speed-data-read operations based on the bank interleave in the DRAM of FIG. 2 according to the present invention. FIGS. 11C through 11Z and 11a through 11f show five repeated sets of the word-line-selection signal (the signal on the global word line 25), the signal SenseEnable for driving the sense amplifiers in the sense amplifier area, the bit-line signal, the row-block-selection signal on the row-block selection line 23, the column-selection signal on the global column-selection line 20, and the signal on the first data bus 24, each set corresponding to one of five row blocks which are accessed in sequence. Hereinafter, the five row blocks are referred to as banks 1 through 5. FIGS. 11A and 11B show a clock signal and a command/address signal, respectively, which is provided in synchronism with the clock signal. FIG. 11g show the data on the first data bus 24 when the data is read from the banks 1 through 5.

In FIG. 11B, the command/address signal has address inputs A, B, C, D, and E, each of which is an address for reading data from the banks 1 through 5, respectively. As shown in the figure, the address inputs are provided once in two clock cycles.

Upon an input of the address A for the bank 1, the word-line-selection signal is supplied to the bank 1 to select a word line. In response, data of memory cells corresponding to the selected word line is supplied to bit lines. The sense-amplifier driving signal SenseEnable is supplied to the sense amplifier to amplify the data on the bit lines. After the data on the bit lines are amplified, the row-block-selection signal on the row-block selection line 23 selects the bank 1, and, at the same time, the column-selection signal is supplied to the global column-selection line 20. Through these operations, the data on the bit lines is transferred to the first data bus 24.

Upon an input of the address B for the bank 2, the word-line-selection signal is supplied to the bank 2 to select a word line. In response, data of memory cells corresponding to the selected word line is supplied to bit lines. The sense-amplifier driving signal SenseEnable is supplied to the sense amplifier to amplify the data on the bit lines. After the data on the bit lines are amplified, the row-block-selection signal on the row-block selection line 23 selects the bank 2, and, at the same time, the column-selection signal is supplied to the global column-selection line 20. Through these operations, the data on the bit lines is transferred to the first data bus 24.

As can be seen from a comparison between the operations of the bank 1 and the operations of the bank 2, each of the word-line-selection signal, the sense-amplifier driving signal, and the bit-line signal is overlaid in time with a counterpart signal between the bank 1 and the bank 2. For example, when the bit-line signal in the bank 2 appears through the data-read operation with respect to the address B by already completing a pre-charge operation, the bit-line signal in the bank 1 is still activated for the data reading of the address A without yet starting a pre-charge operation. In this manner, the bank-interleave operation between the bank 1 and the bank 2 allows the data to be consecutively transferred to the first data bus 24 from the address A in the bank 1 and from the address B in the bank 2.

Likewise, upon input of the address C for the bank 3, the address D for the bank 4, and the address E for the bank 5, data is consecutively transferred from each address to the first data bus 24. In this manner, when five banks 1 through 5 are consecutively accessed through the bank-interleave operation, the first data bus 24 consecutively receives data from the addresses A through E.

As described above, the DRAM of FIG. 2 according to the present invention carries out the word-line selection and the sense-amplifier activation consecutively from row block to row block by overlaying the operation periods between these row blocks, and uses the row-block selection line 23 for selecting each bank (row block) to transfer data from bit lines to the first data bus 24, thereby achieving the bank-interleave operation for rows of the cell blocks 18. This permits the attainment of a high-speed-data-read operation. Further, it is obvious that the same applies as well in the case of the data-write operation.

Further, the present invention is not limited to these embodiments, but variations and modifications may be made without departing from the scope of the present invention.

What is claimed is:

1. A semiconductor memory device comprising:
   a plurality of bit lines;
   first sense amplifiers each connected to a corresponding one of said plurality of bit lines;
   gates each provided for a corresponding one of said first sense amplifiers;
   a first data bus laid out in parallel to said plurality of bit lines and said first data bus connected to a given one of said first sense amplifiers via a corresponding one of said gates; and
   column-selection lines laid out perpendicularly to said plurality of bit lines and said column-selection lines opening at least one of said gates so as to select corresponding at least one of said first sense amplifiers from said first sense amplifiers arranged in a direction perpendicular to said plurality of bit lines.

2. The semiconductor memory device as claimed in claim 1, further comprising:
   a plurality of cell blocks arranged in rows and columns and having cells connected to said bit lines, said columns extending in the same direction as said bit lines;
   global-column-selection lines laid out in parallel to said bit lines with respect to said columns of said cell blocks;
   block-selection lines laid out perpendicularly to said bit lines with respect to said rows of said cell blocks; and
   connection units controlled by said block-selection lines to connect between said global-column-selection lines and said column-selection lines, wherein said first sense amplifiers are arranged along said rows of said cell blocks, and said column-selection lines extend along said rows of said cell blocks.

3. The semiconductor memory device as claimed in claim 2, wherein said connection units select one of said column-selection lines based on signals on said global-column-selection lines and signals on said block-selection lines.

4. The semiconductor memory device as claimed in claim 1, further comprising sense-amplifier drivers for driving said first sense amplifiers, each of said sense-amplifier drivers provided for a corresponding one of said first sense amplifiers.

5. The semiconductor memory device as claimed in claim 1, further comprising sense-amplifier drivers for driving said first sense amplifiers, each of said sense-amplifier drivers provided for a corresponding pair of said first data bus.

6. The semiconductor memory device as claimed in claim 1, further comprising sense-amplifier drivers for driving said first sense amplifiers, each of said sense-amplifier drivers provided for a corresponding unit of column redundancy.

7. The semiconductor memory device as claimed in claim 1, further comprising power lines for shielding pairs of said first data bus from each other, said power lines laid out in parallel to said first data bus.

8. The semiconductor memory device as claimed in claim 2, further comprising:
   second sense amplifiers connected to said first data bus;
   a second data bus connected to said first data bus via said second sense amplifiers; and
   a decoder selectively driving said second sense amplifiers to select at least one of said columns of said cell blocks.

9. The semiconductor memory device as claimed in claim 8, wherein signals transferred via said first data bus have an amplitude smaller than a possible maximum amplitude of said signals.

10. The semiconductor memory device as claimed in claim 8, wherein signals transferred via said second data bus have an amplitude smaller than a possible maximum amplitude of said signals.

11. The semiconductor memory device as claimed in claim 8, wherein said second data bus comprises:
    a read-purpose data bus used for data-read purposes; and
    a write-purpose data bus used for data-write purposes, said write-purpose data bus being different from said read-purpose data bus.

12. The semiconductor memory device as claimed in claim 1, wherein said first data bus extends over cell block areas in which memory cells connected to said plurality of bit lines are arranged.

13. The semiconductor memory device as claimed in claim 2, wherein said global-column-selection lines are arranged between said columns of said cell blocks.

14. A semiconductor memory device carrying out bank-interleave operation, comprising:

a plurality of bit lines;

first sense amplifiers each connected to a corresponding one of said plurality of bit lines;

gates each provided for a corresponding one of said first sense amplifiers;

a first data bus laid out in parallel to said plurality of bit lines and said first data bus connected to a given one of said first sense amplifiers via a corresponding one of said gates; and column-selection lines laid out perpendicularly to said plurality of bit lines and said column-selection lines opening at least one of said gates so as to select corresponding at least one of said first sense amplifiers from said first sense amplifiers arranged in a direction perpendicular to said plurality of bit lines.

15. The semiconductor memory device as claimed in claim 14, further comprising:

a plurality of cell blocks arranged in rows and columns and having cells connected to said bit lines, said columns extending in the same direction as said bit lines;

global-column-selection lines laid out in parallel to said bit lines with respect to said columns of said cell blocks;

block-selection lines laid out perpendicularly to said bit lines with respect to said rows of said cell blocks; and connection units controlled by said block-selection lines to connect between said global-column-selection lines and said column-selection lines, wherein said first sense amplifiers are arranged along said rows of said cell blocks, and said column-selection lines extend along said rows of said cell blocks.

16. The semiconductor device as claimed in claim 15, further comprising a row decoder successively selecting one of said block-selection lines so as to effect said bank-interleave operation with said rows of said cell blocks serving as banks, wherein said connection units connect said global-column-selection lines with said column-selection lines corresponding to said one of said block-selection lines.

* * * * *